United States Patent [19]
Ko et al.

[11] Patent Number: 5,393,693
[45] Date of Patent: Feb. 28, 1995

[54] "BIRD-BEAK-LESS" FIELD ISOLATION METHOD

[75] Inventors: Joe Ko, Hsinchu; Chih-Hung Lin, I-Lai, both of Taiwan, Prov. of China

[73] Assignee: United MicroElectronics Corporation, Hsinchu, Taiwan, Prov. of China

[21] Appl. No.: 254,533

[22] Filed: Jun. 6, 1994

[51] Int. Cl.$^6$ .............................................. H01L 21/76
[52] U.S. Cl. ........................................ 437/69; 437/24
[58] Field of Search ............................... 437/24, 69; 148/DIG. 85, DIG. 86, DIG. 117

[56] References Cited

U.S. PATENT DOCUMENTS

| | | | |
|---|---|---|---|
| 4,234,362 | 11/1980 | Riseman | 148/187 |
| 4,912,062 | 3/1990 | Verma | 437/69 |
| 4,975,126 | 12/1990 | Margail et al. | 145/33.2 |
| 5,298,451 | 4/1994 | Rao | 437/72 |

FOREIGN PATENT DOCUMENTS 60-101944  6/1985  Japan ...................................... 437/72

OTHER PUBLICATIONS

"Selectively Implanted Oxygen Isolation Technology [SIO]" Pub in Electronexs Letters 9, 1985, vol. 21, No. 10 pp. 442-443.

*Primary Examiner*—George Fourson
*Attorney, Agent, or Firm*—George O. Saile; Stephen B. Ackerman

[57] ABSTRACT

A method of forming field oxide isolation regions for submicron technology using oxygen implantation is described. A first insulating layer is formed over a silicon substrate. A second insulating layer is formed over the first insulating layer. A first opening is formed in the first and second insulating layers. Sidewall spacers are formed on the vertical surfaces of the first and second insulating layers, within the first opening, to define a second, smaller opening. A portion of the silicon substrate is removed in the region defined by the second, smaller opening, to form an etched region of the silicon substrate. The sidewall spacers are removed. Oxygen is implanted into the etched region of the silicon substrate and into the region of the silicon substrate under the former location of the sidewall spacers. A portion of the polycrystalline silicon in and above the etched region of the silicon substrate. The field oxide isolation region is formed by heating. The remainder of the first and second insulating layers are removed.

19 Claims, 5 Drawing Sheets

"BIRD-BEAK-LESS" FIELD ISOLATION METHOD

BACKGROUND OF THE INVENTION (1) Field of the Invention

The invention relates to the manufacture of highly dense integrated circuits, and more particularly to the formation of field oxide isolation regions by selective oxygen implantation within the integrated circuits.

(2) Description of the Related Art

In the manufacture of highly dense integrated circuits, individual device structures are typically separated and electrically isolated by means of a field oxide isolation region. The isolation region is typically produced by the exposure of a silicon wafer to an oxidizing atmosphere while using an oxidation mask to protect regions which are not desired to be oxidized. These latter regions will be the location for the active device structures. One widely used technique for creating isolation regions is LOCOS-LOCal Oxidation of Silicon.

In the LOCOS technique, a pad oxide is grown on the surface of a silicon substrate. The pad oxide reduces stresses during field oxidation between the silicon substrate and a subsequently deposited silicon nitride layer. The silicon nitride is deposited by chemical vapor deposition (CVD) on the surface of the pad oxide, and then patterned to create an oxidation mask. The silicon nitride forms an effective mask during field oxidation due to the slow speed with which oxygen and water vapor diffuses in the nitride. The oxidation mask is formed by dry etching the nitride and pad oxide in the region in which it is desired to form the field oxide. An implant is performed in the field region to create a channel-stop doping layer under the field oxide. The field oxide is then grown by wet oxidation, at a temperature of about 1000° C. The masking layer is removed by a wet etch. A sacrificial pad oxide is then formed and removed, to prepare for subsequent formation of the gate oxide.

The LOCOS technology has been used widely, but it presents several drawbacks at dimensions between 1 and 2 micrometers, and for submicron technology the conventional LOCOS cannot be used without significant modification. Attempts have been made to provide field isolation for submicron devices, but many provide only partial solutions. Particularly, the problem of punchthrough (leakage and isolation issues) have not been adequately solved. If the silicon surface under the field oxide is inverted, the two transistors may short and isolation between them is effectively broken down. When the spacing between active devices, and the field oxide thickness, are scaled down as is necessary for CMOS (Complementary Metal Oxide Semiconductor) VLSI (Very Large Scale Integration), leakage current paths are more likely to form, causing unwanted DC power dissipation, noise margin degradation, and voltage shift on a dynamic node.

Other problems which have not been adequately resolved include "bird's beak" formation and lack of latch-up immunity. During oxidation, there is significant lateral oxidation encroachment from under the nitride mask in conventional LOCOS, resulting in the formation of a "bird's beak" structure at the perimeter of the field oxide, which reduces the area available in the active region (also known as the narrow width effect), thus lowering the total number of devices that can be fit onto a single integrated circuit chip. Furthermore, as CMOS feature sizes continue to shrink, lateral and vertical dimensions are scaled down, resulting in better parasitic bipolar transistors. Leakage currents under the field oxide can cause forward biasing emitter-base junctions, activating both bipolar devices. Latch-up, which occurs in CMOS devices, can result in momentary or permanent loss of circuit function.

Workers in the field are aware of these problems. One approach is to use a shorter oxidation period as can be obtained by implantation of oxygen in the field region, prior to field oxidation, as described in "Selectively Implanted Oxygen Isolation Technology (SIO)", P. Ratnam et al, Electronics Letters, May 9, 1985, Vol. 21 No. 10, pp. 442–443. Oxygen is selectively implanted to create a damaged Si—SiOx—Si layer in the field region, which is then thermally oxidized for a short period to form the field oxide.

SUMMARY OF THE INVENTION

Accordingly, it is a principal object of the invention to provide a method for forming field oxide isolation regions for submicron technology.

It is a further object of the invention to provide a method of forming field oxide isolation regions which solves the problem of punchthrough.

It is a further object of the invention to provide a method to eliminate the bird's beak during formation of a field oxide isolation regions.

It is a further object to provide a method of forming field oxide isolation regions that increases the latch-up immunity.

These objects are achieved by a first method of forming a field oxide isolation region, in which a first insulating layer is formed over a silicon substrate. A second insulating layer is formed over the first insulating layer. A first opening is formed in the first and second insulating layers. Sidewall spacers are formed on the vertical surfaces of the first and second insulating layers, within the first opening, to define a second, smaller opening. A portion of the silicon substrate is removed in the region defined by the second, smaller opening, to form an etched region of the silicon substrate. The sidewall spacers are removed. Oxygen is implanted into the etched region of the silicon substrate and into the region of the silicon substrate under the former location of the sidewall spacers. A portion of the polycrystalline silicon in and above the etched region of the silicon substrate. The field oxide isolation region is formed by heating. The remainder of the first and second insulating layers are removed.

These objects are further achieved by a second method of forming a field oxide isolation region, in which a first insulating layer is formed over a silicon substrate. A second insulating layer is formed over the first insulating layer. A first opening is formed in the second insulating layer. Sidewall spacers are formed on the vertical surfaces of the second insulating layer, within the first opening, to define a second, smaller opening. A portion of the silicon substrate and the first insulating layer are removed in the region defined by the second, smaller opening, to form an etched region of the silicon substrate. Oxygen is implanted into the silicon substrate in region defined by the second, smaller opening. A layer of polycrystalline silicon is formed in and above the etched region of the silicon substrate, over the second insulating layer, and over the sidewall spacers. A third insulating layer is formed over the layer of polycrystalline silicon. The field oxide isolation region is formed by heating. The remainder of the first, second and third insulating layers, the sidewall spacers and remainder of the layer of polycrystalline silicon are removed.

DESCRIPTION OF THE PREFERRED EMBODIMENTS

Figure 1:
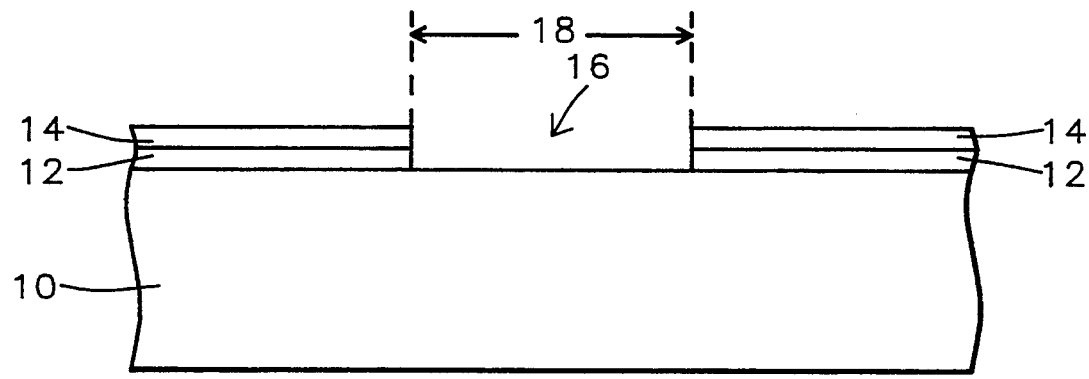
FIGS. 1 to 7 are a cross-sectional representation of one method of the invention for forming a field oxide isolation region.

Referring now more particularly to FIGS. 1 to 7 there is shown a first method for making the field oxide isolation region of the present invention. A single-crystal silicon substrate 10 of crystal orientation (100) is provided which has been lightly doped with boron or phosphorus at a dosage of between about 5 E 12 and 2 E 13 atoms/cm.2. A layer of silicon oxide (SiO2) 12 is formed over the silicon substrate by a furnace process, at a temperature of between about 900° and 1000° C., and has a resultant thickness of between about 100 and 300 Angstroms. A layer of silicon nitride (Si3N4) 14 is formed over the SiO2 layer by CVD (Chemical Vapor Deposition), to a thickness of between about 1000 and 3000 Angstroms. The thickness of these two layers combined must be sufficient to prevent penetration of implanted oxygen into the masked regions during the subsequent oxygen implantation step. The nitride layer 14 and oxide layer 12 are patterned, as shown in FIG. 1, using conventional lithography and etching, to form an opening 16 at the desired location of the field oxide region. This opening has a width 18 of between about 0.5 and 1.0 micrometers, with minimum width determined by resolution limits of lithography equipment.

Figure 2:
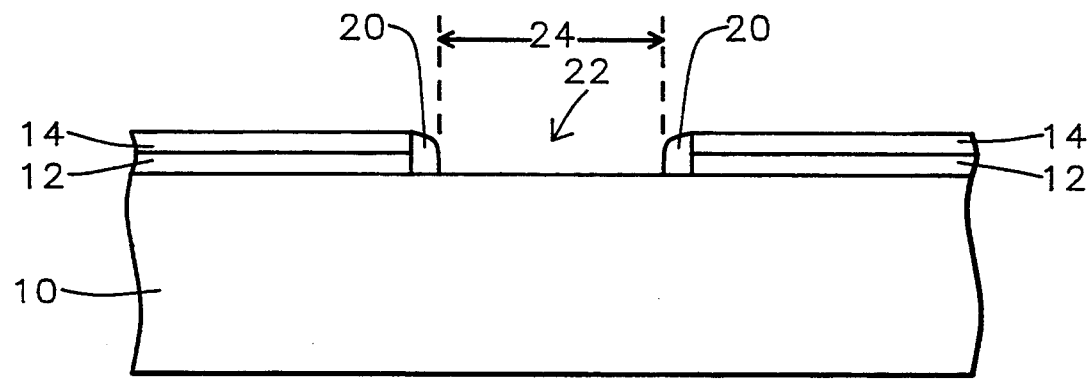

Referring now to FIG. 2, sidewall spacers 20 are formed by first depositing a layer of SiO2 (silicon dioxide) by APCVD (Atmospheric Pressure Chemical Vapor Deposition) to a thickness of between about 1000 and 2500 Angstroms. This layer is then anisotropically etched such that the horizontal portions are etched away, and the substantially vertical portions remain as the sidewall spacers 20. It can be seen that the size of the narrower opening 24 can be controlled by varying the thickness of the SiO2 layer used to create the sidewall spacers 20.

Figure 3:
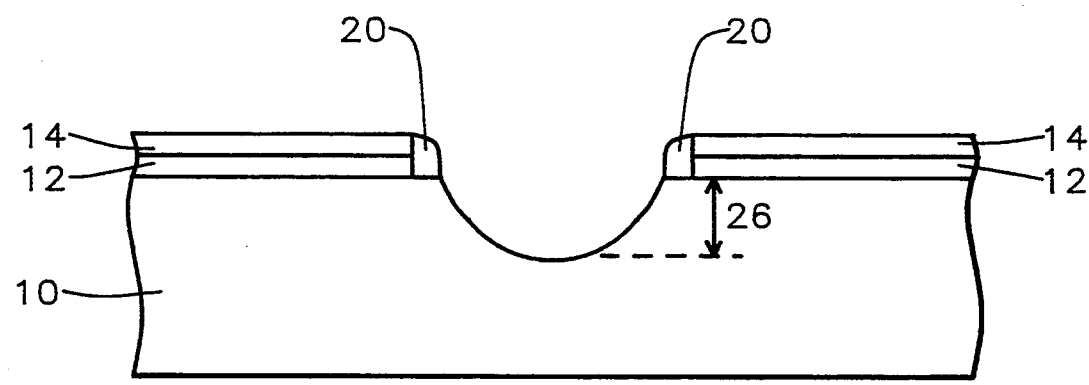
Figure 4:
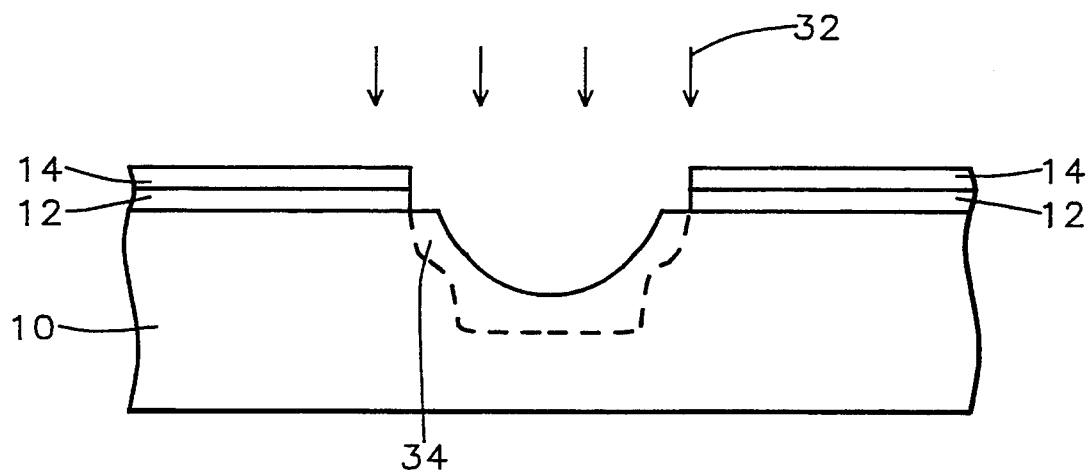

With reference to FIG. 3, silicon substrate 10 is etched in the region defined by opening 22 (from FIG. 2) by etching with a planar plasma machine to a depth 26 of between about 2000 and 5000 Angstroms. As seen in FIG. 4, the spacers 20 are removed by etching in are removed by dipping in HF (hydrofluoric acid).

The critical oxygen implant 32 is now performed, using the original opening 16 in nitride layer 14 as a mask, to implant oxygen (02) 34 in the substrate. The implant is performed using a dosage of between about 1 E 18 and 1 E 19 atoms/cm.2 and an energy of between about 50 and 100 KeV. This implant creates considerable substrate defects, on the order of between about 1 E 7 and 1 E 10 atoms/cm.2 to a depth of between about 100 and 500 Angstroms, which enables a much faster oxidation rate during subsequent formation of the field oxide region.

Figure 5:
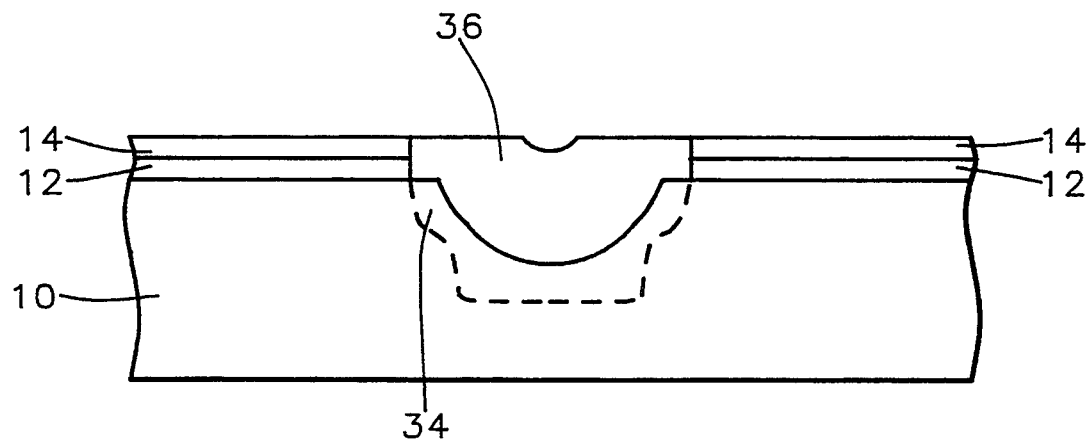

Referring now to FIG. 5, after the above implant, a layer of polycrystalline silicon is deposited by LPCVD (Low Pressure Chemical Vapor Deposition) to a thickness of between about 3000 and 5000 Angstroms. This layer is etched back by an anisotropic etch, to leave a portion 36 in and above the etched region of substrate 10, and the top surface is substantially planar with nitride layer 14.

Figure 6:
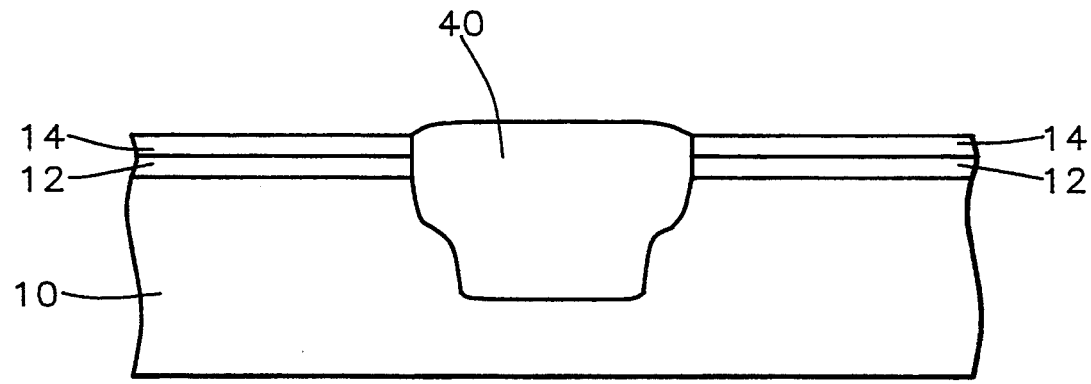
Figure 7:
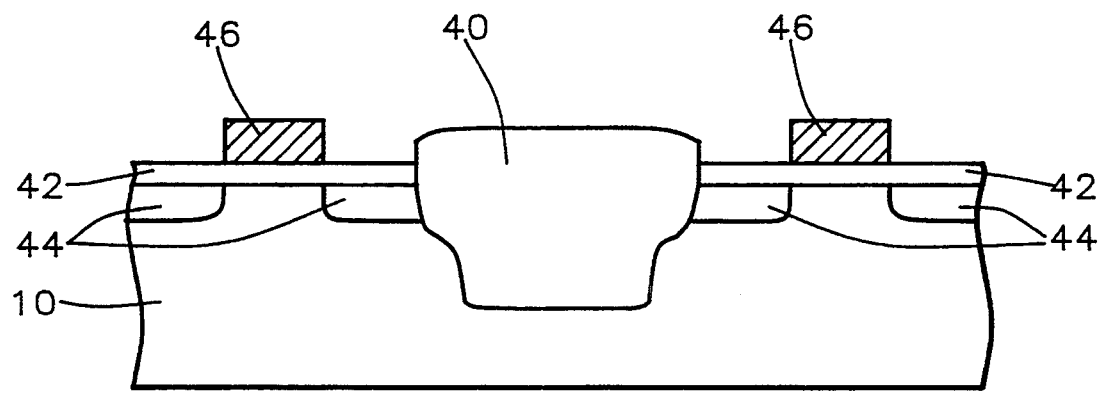

Referring now to FIG. 6, the field oxidation is performed to form field oxide 40. An anneal is performed in a 100% nitrogen (N2) ambient at a temperature of between about 900° and 1200° C. for between about 60 and 180 minutes. Due to the short time required for the field oxidation, due to the presence of the implanted oxygen in the damaged portions of the substrate, the typical bird's beak structure at the field oxide edge does not form. The oxidation rate of seriously ion-damaged silicon is more than three times that of an unimplanted silicon substrate. Since there is a high concentration of (implanted) oxygen already present, during the high-temperature oxidation step the implanted oxygen diffuses easily into the damaged silicon structure, and less time is needed to form the thick field oxide. Therefore, less oxidation time is required.

The nitride layer 14 is removed, and a channel stop implant performed. Where a P-type implant is desired, boron is implanted at a dosage of between about 5 E 12 and 2 E 13 atoms/cm.2 and at an energy of between about 150 and 250 KeV. Where an N-type implant is desired, phosphorus is implanted at a dosage of between about 5 E 12 and 2 E 13 atoms/cm.2 and at an energy of between about 180 and 300 KeV. The first SiO2 layer 12 is removed, a sacrificial oxide (not shown) is formed and removed, and a gate oxide layer is formed. Further processing continues to form devices in the active regions between the field oxide regions. As shown in the FIG. 7 example, field effect transistors are formed by implanting source/drain regions 44 in substrate 10, and forming gates 46 on the gate oxide. Details are not given here as they are not important to the invention and are known in the art. Further processing (not shown) would then occur to complete manufacture of the integrated circuit, such as formation of a thick dielectric over the devices, contact formation, metallization and passivation. Many such field oxide regions and active devices would be formed simultaneously with those shown in the drawings across the substrate surface.

Figure 8:
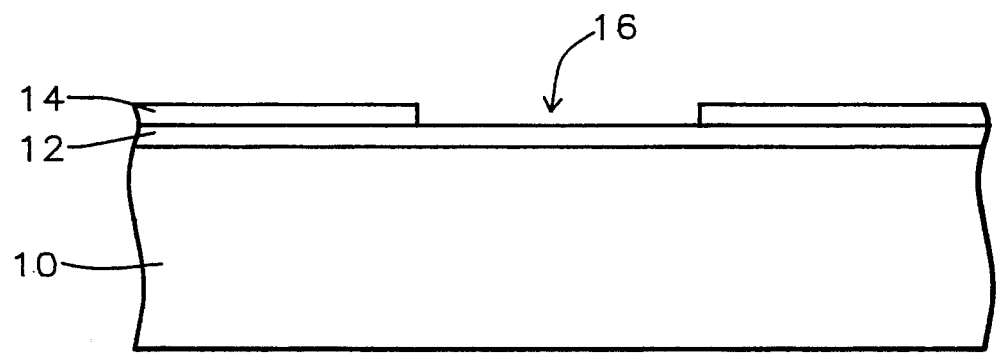
FIGS. 8 to 14 are a cross-sectional representation of a second method of the invention for forming a field oxide isolation region.
Figure 9:
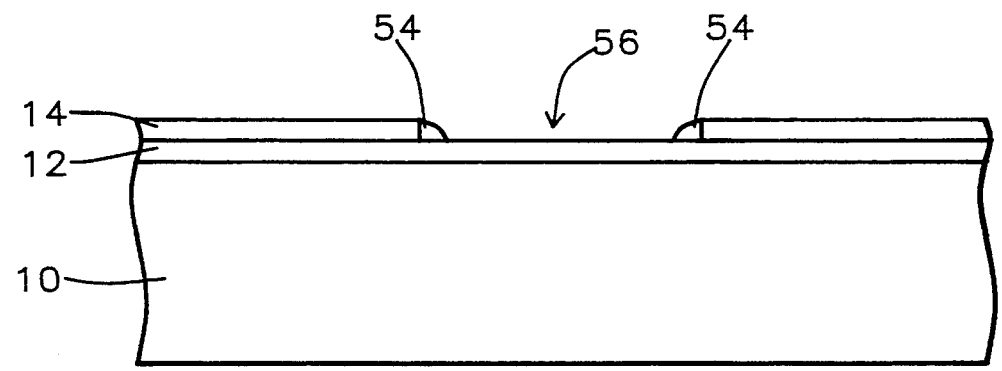

In the second method of the invention, described with reference to FIGS. 8 to 14, the process steps are the same as in the first method up to the formation of the FIG. 8 structure. With reference to FIG. 9, sidewall spacers 54 are formed by first depositing a layer of SiO2 by APCVD to a thickness of between about 1000 and 2500 Angstroms. This layer is then anisotropically etched such that the horizontal portions are etched away, and the substantially vertical portions remain as the sidewall spacers 54. It can be seen that the size of the narrower opening 56, and the trench width of the subsequent etching step, can be controlled by varying the thickness of the SiO2 layer used to create the sidewall spacers 54.

Figure 10:
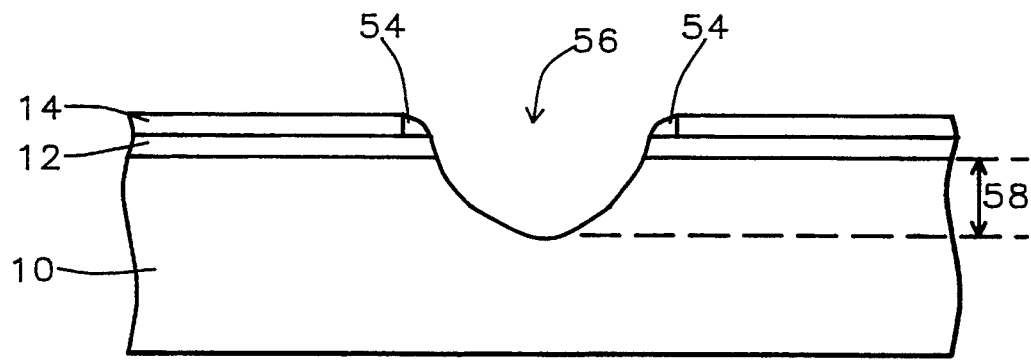
Figure 11:
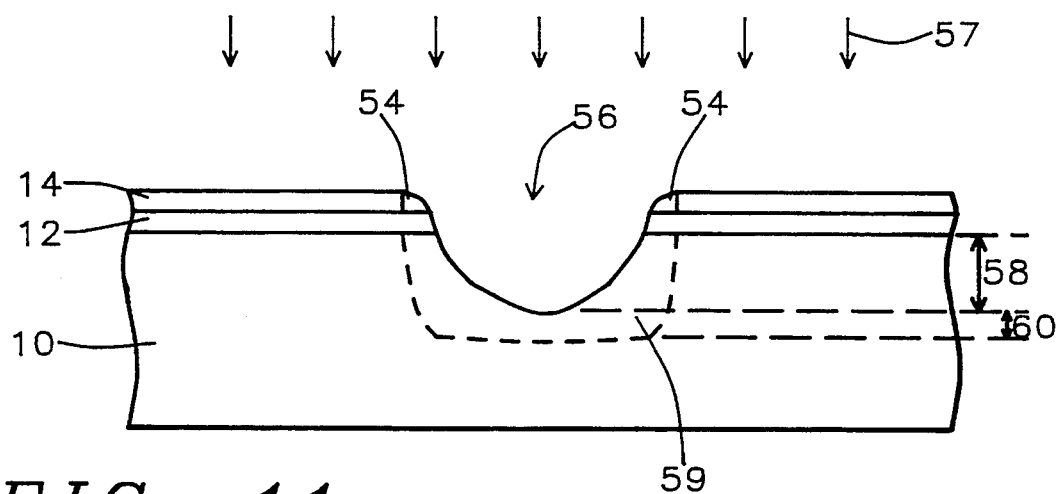

With reference to FIG. 10, SiO2 layer 12 and silicon substrate 10 are etched in the region defined by opening 56 by etching with a planar plasma machine, to a depth 58 of between about 2000 and 5000 Angstroms. As shown in FIG. 11, the critical oxygen implant 57 is performed, using the spacers 54 as a mask, to implant oxygen (02) 59 in the substrate. The implant is performed using a dosage of between about 1 E 18 and 1 E 19 atoms/cm.2 and an energy of between about 50 and 100 KeV, and the implanted oxygen 59 has a resultant junction depth 60 of between about 0.1 and 0.3 micrometers.

Figure 12:
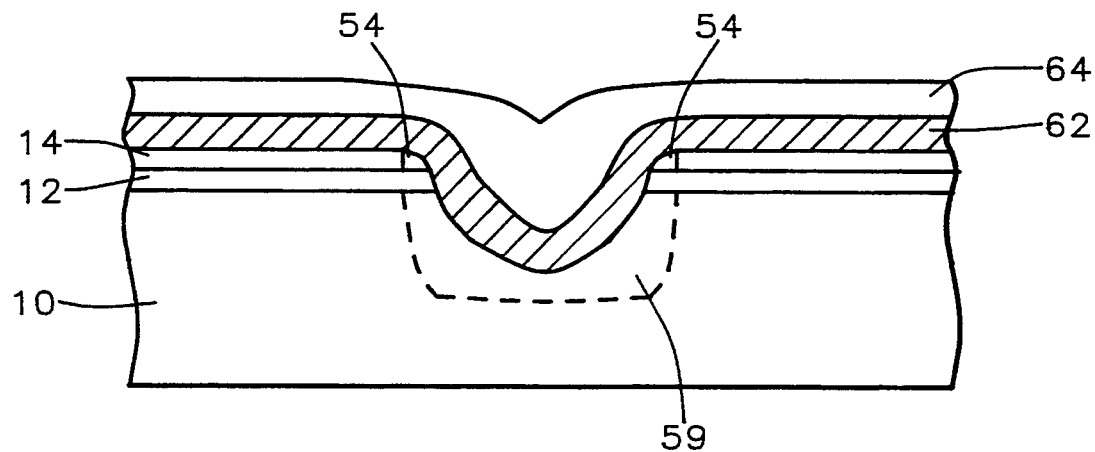

Referring now to FIG. 12, a layer of polycrystalline silicon 62 is deposited by LPCVD to a thickness of between about 1000 and 5000 Angstroms. A silicon nitride (Si3N4) layer 64 is then deposited over the polysilicon layer by CVD to a thickness of between about 3000 and 10,000 Angstroms.

Figure 13:
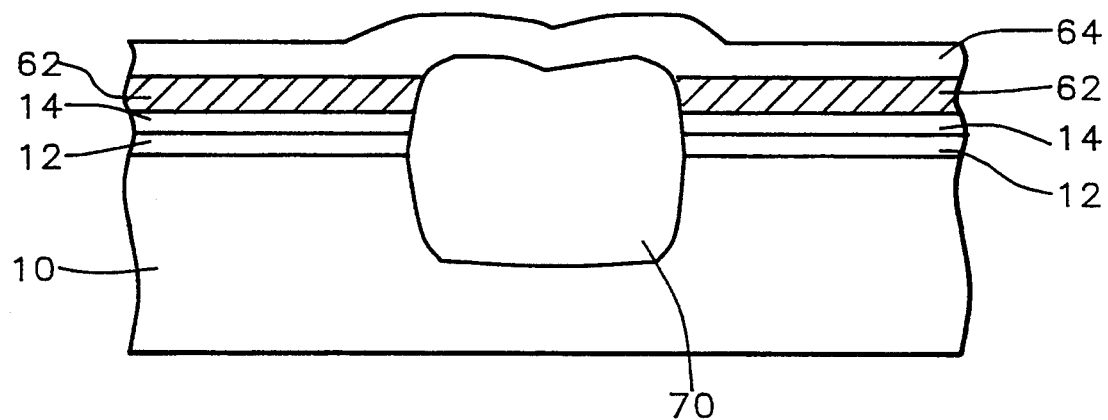

Referring now to FIG. 13, the field oxidation is performed to form field oxide 70. An anneal is performed in a 100% nitrogen (N2) ambient at a temperature of between about 900° and 1200° C. for between about 60 and 180 minutes. As in the first method of the invention, due to the short time required for the field oxidation and the presence of the implanted oxygen in the damaged portions of the substrate, the typical bird's beak structure at the field oxide edge does not form.

Figure 14:
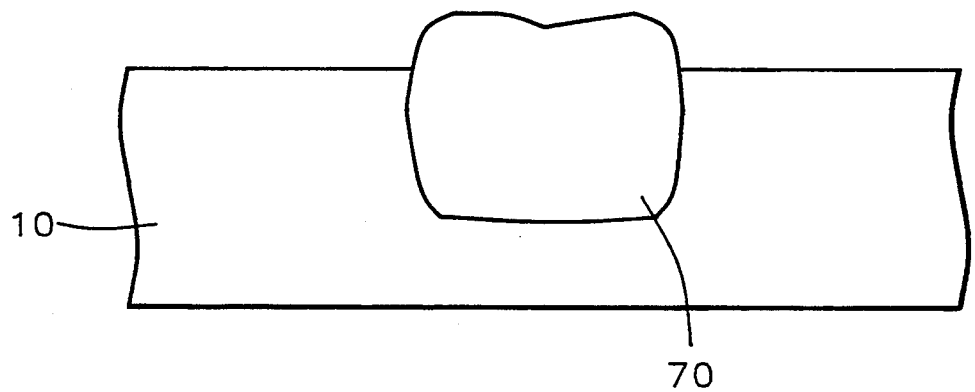

As shown in FIG. 14, the two nitride layers 14 and 64, poly layer 62 and oxide layer 12 are removed by etching to leave field oxide 70, after which a channel-stop implant and further processing to complete the integrated circuit are performed, as described in the first method above.

While the invention has been particularly shown and described with reference to the preferred embodiments thereof, it will be understood by those skilled in the art that various changes in form and details may be made without departing from the spirit and scope of the invention.

What is claimed is:

1. A method of forming a field oxide isolation region, comprising the steps of:
   forming a first insulating layer over a silicon substrate;
   forming a second insulating layer over said first insulating layer;
   forming a first opening in said first and second insulating layers;
   forming sidewall spacers on the vertical surfaces of said first and second insulating layers, within said first opening, to define a second, smaller opening;
   removing a portion of said silicon substrate in the region defined by said second, smaller opening, to form an etched region of said silicon substrate;
   removing said sidewall spacers;
   implanting oxygen into said etched region of said silicon substrate and into the regions of said silicon substrate under the former locations of said sidewall spacers;
   forming a portion of polycrystalline silicon in and above said etched region of said silicon substrate;
   forming said field oxide isolation region by heating the resulting structure in an oxidizing ambient; and
   removing the remainder of said first and second insulating layers.

2. The method of claim 1 wherein said forming a portion of polycrystalline silicon in and above said etched region of said silicon substrate comprises the steps of:
   forming a layer of polycrystalline silicon over the entire resulting structure; and
   etching back said layer of polycrystalline silicon to form said portion of polycrystalline silicon.

3. The method of claim 2 wherein said first insulating layer is silicon oxide, formed to a thickness of between about 100 and 300 Angstroms, and said second insulating layer is silicon nitride formed to a thickness of between about 1000 and 3000 Angstroms.

4. The method of claim 3 wherein said forming sidewall spacers comprises the steps of:
   forming a layer of silicon oxide over said second insulating layer and in said first opening; and
   anisotropically etching said layer of silicon oxide to remove horizontal portions of said layer of silicon oxide and leave said sidewall spacers.

5. The method of claim 4 wherein said layer of silicon oxide is formed to a thickness of between about 1000 and 2500 Angstroms, whereby said thickness determines the width of said sidewall spacers and the size of said second, smaller opening.

6. The method of claim 5 wherein said first opening has a width of between about 0.5 and 1.0 micrometers.

7. The method of claim 6 wherein said oxygen is implanted at a dosage of between about $10^{18}$ and $10^{19}$ atoms/cm.$^2$ and at an energy of between about 50 and 100 KeV.

8. The method of claim 7 wherein said forming said field oxide isolation region is by heating at a temperature of between about 900° and 1200° C. for between about 60 and 180 minutes, in an ambient of nitrogen.

9. A method of forming a field oxide isolation region, comprising the steps of:
   forming a first insulating layer over a silicon substrate;
   forming a second insulating layer over said first insulating layer;
   forming a first opening in said second insulating layer;
   forming sidewall spacers on the vertical surfaces of said second insulating layer, within said first opening, to define a second, smaller opening;
   removing a portion of said silicon substrate and said first insulating layer in the region defined by said second, smaller opening, to form an etched region of said silicon substrate;
   implanting oxygen into said silicon substrate in the region defined by said second, smaller opening;
   forming a layer of polycrystalline silicon in and above said etched region of said silicon substrate, over said second insulating layer, and over said sidewall spacers;
   forming a third insulating layer over said layer of polycrystalline silicon;
   forming said field oxide isolation region by heating the resulting structure in an oxidizing ambient; and
   removing the remainder of said first, second and third insulating layers, said sidewall spacers and the remainder of said layer of polycrystalline silicon.

10. The method of claim 9 wherein said first insulating layer is silicon oxide, formed to a thickness of between about 100 and 300 Angstroms, and said second insulating layer is silicon nitride formed to a thickness of between about 1000 and 3000 Angstroms.

11. The method of claim 9 wherein said forming sidewall spacers comprises the steps of:
   forming a layer of silicon oxide over said second insulating layer and in said first opening over said first insulating layer; and
   anisotropically etching said layer of silicon oxide to remove horizontal portions of said layer of silicon oxide and to leave said sidewall spacers.

12. The method of claim 11 wherein said layer of silicon oxide is formed to a thickness of between about 1000 and 2500 Angstroms, whereby said thickness determines the width of said sidewall spacers and the size of said second, smaller opening.

13. The method of claim 9 wherein said second, smaller first opening has a width of between about 0.2 and 0.8 micrometers.

14. The method of claim 9 wherein said oxygen is implanted at a dosage of between about $10^{18}$ and $10^{19}$ atoms/cm.$^2$ and at an energy of between about 50 and 100 KeV, whereby said oxygen is implanted to a peak junction depth of between about 0.1 and 0.3 micrometers.

15. The method of claim 9 wherein said etched region is formed to a depth of between about 2000 and 5000 Angstroms.

16. The method of claim 9 wherein said forming said field oxide isolation region is by heating at a temperature of between about 900° and 1200° C. for between about 60 and 180 minutes, in an ambient of nitrogen.

17. The method of claim 9 wherein said layer of polycrystalline silicon is formed to a depth of between about 1000 and 5000 Angstroms.

18. The method of claim 9 wherein said third insulating layer is formed to a depth of between about 3000 and 10,000 Angstroms.

19. A method of forming field effect transistors (FETs) separated by field oxide isolation regions, comprising the steps of:

forming a first insulating layer over a silicon substrate;

forming a second insulating layer over said first insulating layer;

forming a plurality of first openings in said first and second insulating layers;

forming sidewall spacers on the vertical surfaces of said first and second insulating layers, within said first openings, to define second, smaller openings;

removing a portion of said silicon substrate in the regions defined by said second, smaller openings, to form etched regions of said silicon substrate;

removing said sidewall spacers;

implanting oxygen into said etched regions of said silicon substrate and into the regions of said silicon substrate under the former locations of said sidewall spacers;

forming a portion of polycrystalline silicon in and above said etched regions of said silicon substrate;

forming said field oxide isolation regions by heating the resulting structure in an oxidizing ambient;

removing the remainder of said first and second insulating layers;

forming a sacrificial oxide layer over the exposed portion of said silicon substrate;

removing said sacrificial oxide layer;

forming a gate oxide layer over the exposed portion of said silicon substrate; and forming said field effect transistors between said field oxide isolation regions, in and over said silicon substrate.

* * * * *